(12) United States Patent
Umeda et al.

(10) Patent No.: US 8,390,029 B2
(45) Date of Patent: Mar. 5, 2013

(54) SEMICONDUCTOR DEVICE FOR REDUCING AND/OR PREVENTING CURRENT COLLAPSE

(75) Inventors: Hidekazu Umeda, Osaka (JP);
Masahiro Hikita, Hyogo (JP); Tetsuzo Ueda, Osaka (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 162 days.

(21) Appl. No.: 12/867,427

(22) PCT Filed: Jan. 23, 2009

(86) PCT No.: PCT/JP2009/000258
§ 371 (c)(1),
(2), (4) Date: Aug. 12, 2010

(87) PCT Pub. No.: WO2009/116223
PCT Pub. Date: Sep. 24, 2009

(65) Prior Publication Data
US 2011/0012173 A1    Jan. 20, 2011

(30) Foreign Application Priority Data

Mar. 21, 2008  (JP) ................................ 2008-074539

(51) Int. Cl.
*H01L 29/00* (2006.01)
(52) U.S. Cl. ........................................ 257/192; 257/200
(58) Field of Classification Search .................. 257/192, 257/200
See application file for complete search history.

(56) References Cited

U.S. PATENT DOCUMENTS

| | | | |
|---|---|---|---|
| 7,576,373 | B1 | 8/2009 | Hikita et al. |
| 2005/0189559 | A1 | 9/2005 | Saito et al. |
| 2006/0138454 | A1 | 6/2006 | Saito et al. |
| 2007/0045670 | A1 | 3/2007 | Kuraguchi |
| 2007/0051979 | A1 | 3/2007 | Kambayashi et al. |
| 2007/0164314 | A1 | 7/2007 | Beach et al. |
| 2007/0170463 | A1 | 7/2007 | Ueno et al. |
| 2007/0278507 | A1 | 12/2007 | Nakazawa et al. |
| 2008/0121896 | A1 | 5/2008 | Takizawa et al. |

FOREIGN PATENT DOCUMENTS

| | | |
|---|---|---|
| JP | 2002-359256 | 12/2002 |
| JP | 2005-235935 | 9/2005 |
| JP | 2005-244072 | 9/2005 |
| JP | 2006-032650 | 2/2006 |
| JP | 2007-220895 | 8/2007 |
| JP | 2007-317805 | 12/2007 |
| JP | 2007-324263 | 12/2007 |
| JP | 2008-010461 | 1/2008 |

*Primary Examiner* — Long Pham
*Assistant Examiner* — Steven Rao
(74) *Attorney, Agent, or Firm* — McDermott Will & Emery LLP (57) ABSTRACT

A semiconductor device includes an undoped GaN layer (103) formed on a substrate (101), an undoped AlGaN layer (104) formed on the undoped GaN layer (103) and having a band gap energy larger than that of the undoped GaN layer (103), a p-type AlGaN layer (105) and a high-concentration p-type GaN layer (106) formed on the undoped AlGaN layer (104), and an n-type AlGaN layer (107) formed on the high-concentration p-type GaN layer (106). A gate electrode (112) which makes ohmic contact with the high-concentration p-type GaN layer (106) is formed on the high-concentration p-type GaN layer (106) in a region thereof exposed through an opening (107*a*) formed in the n-type AlGaN layer (107).

8 Claims, 8 Drawing Sheets

SEMICONDUCTOR DEVICE FOR REDUCING AND/OR PREVENTING CURRENT COLLAPSE

RELATED APPLICATIONS

This application is the U.S. National Phase under 35 U.S.C. §371 of International Application No. PCT/JP2009/000258, filed on Jul. 23, 2009, which in turn claims the benefit of Japanese Application No. 2008-074539, filed on Mar. 21, 2008, the disclosures of which Applications are incorporated by reference herein.

TECHNICAL FIELD

The present invention relates to semiconductor devices made of a nitride semiconductor which are applicable to power transistors for use in, for example, power supply circuits for consumer apparatuses and the like.

BACKGROUND ART

Group III nitride semiconductors, such as notably gallium nitride (GaN), are wide gap semiconductors. For example, gallium nitride (GaN) and aluminum nitride (AlN) have energy gaps of as large as 3.4 eV and 6.2 eV, respectively, at room temperature. The Group III nitride semiconductors also have large breakdown electric fields, and higher electron saturation velocities than those of compound semiconductors such as gallium arsenide (GaAs) and the like, silicon (Si), and the like. Due to these properties, field effect transistors (FETs) made of a GaN-based compound semiconductor material, which are used as high frequency electronic devices or high power electronic devices, have been vigorously studied and developed.

Nitride semiconductor materials, such as GaN and the like, can be used along with AlN or indium nitride (InN) to produce various mixed crystals, and therefore, can provide a heterojunction as with conventional arsenide-based semiconductor materials, such as GaAs and the like. The heterojunction provided by the nitride semiconductor (e.g., an AlGaN/GaN heterostructure) has a property that a high concentration of carriers which are generated by spontaneous polarization and piezoelectric polarization occur at the interface without doping with an impurity. Therefore, when an FET is made of the nitride semiconductor, the FET is likely to be of the depletion mode type (normally on type), but not of the enhancement mode type (normally off type). However, because most of the devices currently used in the field of power electronics are of the normally off type, there is a strong demand for normally off GaN-based nitride semiconductor devices as well.

Normally off transistors are caused to be normally off by, for example, the following reported methods: a so-called recess structure is formed in which the AlGaN layer of the AlGaN/GaN structure is thinned only in a portion below the gate electrode to reduce the concentration of two-dimensional electron gas (2DEG), thereby shifting the threshold voltage to a positive value; and the GaN layer having a plane orientation {11-20} is grown on a main surface of a sapphire substrate which has a plane orientation {10-12}, thereby reducing or preventing the generation of a polarized field in a direction perpendicular to the main surface of the sapphire substrate. Here, a minus sign "−" added to a Miller index in a plane orientation indicates the reciprocal of the index following the minus sign for the sake of convenience.

As a promising structure which can provide a normally off FET, a junction field effect transistor (JFET) has been proposed in which a p-type AlGaN layer is formed in a portion where the gate electrode is formed. In the JFET structure, the p-type AlGaN layer is connected to a barrier layer made of AlGaN so that the potential energy of the AlGaN layer is raised. As a result, the concentration of two-dimensional electron gas formed immediately below the gate electrode formation portion in which the p-type AlGaN layer is formed, can be reduced, whereby the JFET is allowed to operate in a normally off mode. Moreover, because a pn junction, which has a higher built-in potential than that of a Schottky junction between a metal and a semiconductor, is used in the gate electrode formation portion, the rising voltage of the gate can be increased. Therefore, even when a positive gate voltage is applied, the gate leakage current can be limited to a small level.

Note that, here, AlGaN denotes $Al_xGa_{1-x}N$ where x is $0<x<1$, InGaN denotes $In_yGa_{1-y}N$ where y is $0<y<1$, and InAlGaN denotes $In_yAl_xGa_{1-x-y}N$ where x and y are $0<x<1$, $0<y<1$, and $0<x+y<1$. This expression is also used in the descriptions below.

CITATION LIST

Patent Document

PATENT DOCUMENT 1: Japanese Patent Laid-Open Publication No. 2007-220895

SUMMARY OF THE INVENTION

Technical Problem

However, in the conventional JFET made of a nitride semiconductor, the distance between the uppermost surface of the semiconductor layer and the two-dimensional electron gas layer in a region excluding the gate electrode formation portion is as small as about 25 nm, which corresponds to the thickness of the undoped AlGaN layer (barrier layer), and therefore, the two-dimensional electron gas layer is likely to be affected by a depletion layer formed by electrons trapped at the surface level. Therefore, when the FET is operated with a high drain voltage, the drain current is likely to decrease, i.e., a so-called current collapse phenomenon is likely to occur, which is a problem.

Figure 12:
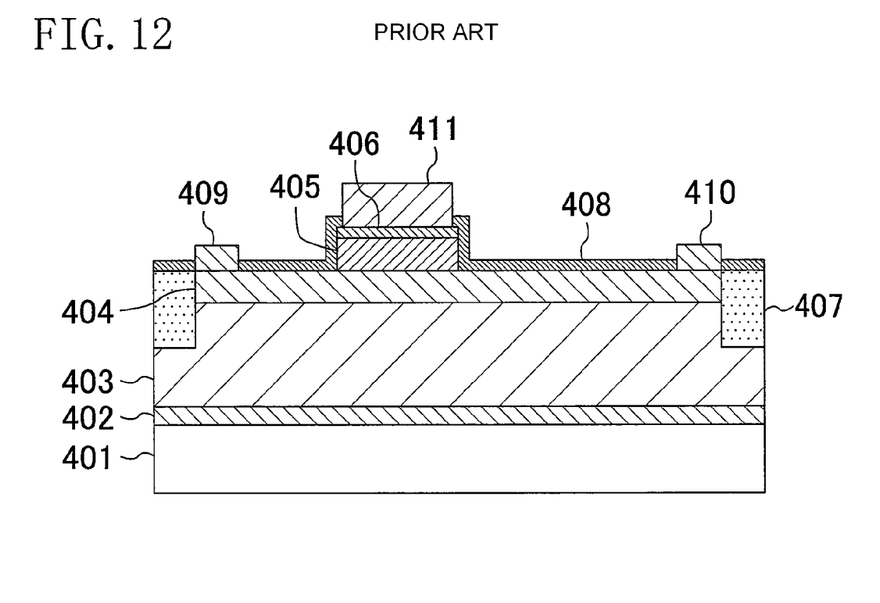
FIG. 12 is a cross-sectional view showing a conventional nitride semiconductor transistor.

As shown in FIG. 12, the conventional JFET made of a nitride semiconductor includes a buffer layer 402 made of AlN, a channel layer 403 made of undoped GaN, a barrier layer 404 made of undoped AlGaN, and a p-type AlGaN layer 405 and a high-concentration p-type GaN layer 406 selectively provided between the barrier layer 404 and the gate electrode 411, which are successively formed on a substrate 401 made of sapphire.

A source electrode 409 and a drain electrode 410 are formed on the barrier layer 404 in regions on opposite sides of the gate electrode 411 which are located at respective distances from the gate electrode 411. Here, the gate electrode 411, which is made of, for example, nickel (Ni), makes ohmic contact with the high-concentration p-type GaN layer 406. The source electrode 409 and the drain electrode 410 are each made of a multilayer film including a titanium (Ti) layer and an aluminum (Al) layer, where the titanium layer is closer to the substrate. Moreover, the surface is covered with a protective film made of silicon nitride (SiN).

Figure 13:
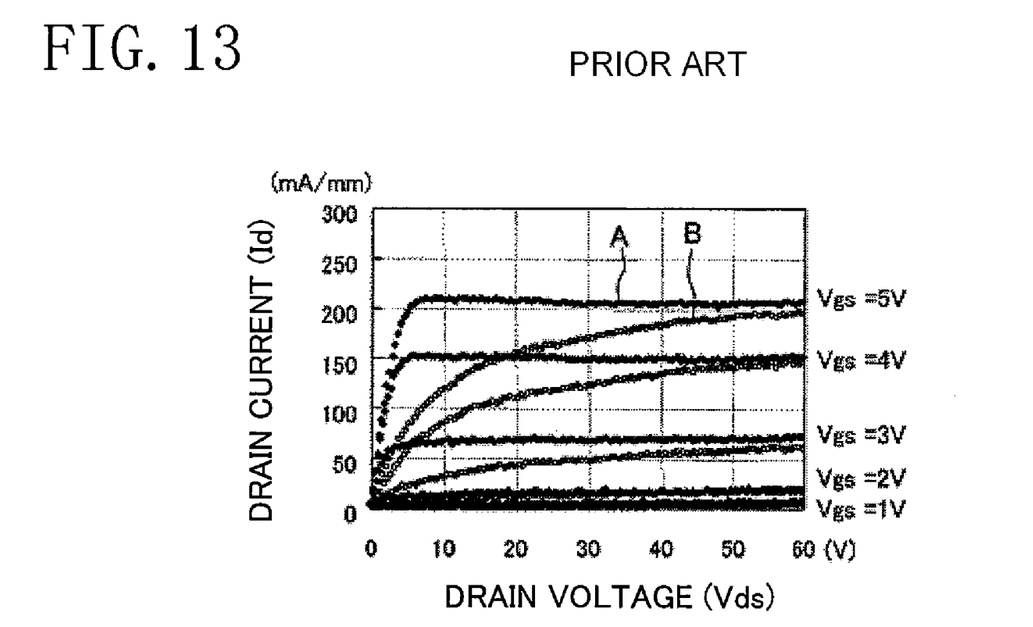
FIG. 13 is a graph showing a relationship between drain currents and gate voltages in the conventional nitride semiconductor transistor, as measured when a pulse voltage is applied.

FIG. 13 shows a relationship between drain currents Id and drain voltages Vds as measured when pulse voltages having the same period are applied to the gate electrode 411 and the drain electrode 410 in the conventional JFET of FIG. 12.

Here, it is assumed that the pulse voltages applied to the gate electrode 411 and the drain electrode 410 have a pulse width of 0.5 μs and a pulse interval of 1 ms.

In FIG. 13, lines A are obtained when the gate voltage and the drain voltage are both 0 V before a pulse voltage is applied (bias conditions), and lines B are obtained when the gate voltage is 0 V and the drain voltage is 60 V before a pulse voltage is applied (bias conditions). As can be seen from FIG. 13, for example, the drain current Id is reduced by about 90 mA/mm in the case of a line B of the gate voltage Vgs=5 V where the drain voltage Vds is 10 V, compared to the case of a line A of the gate voltage Vgs=5 V where the drain voltage Vds is 10 V. Thus, it can be seen that, when a higher drain voltage is applied to the drain electrode 410 before a bias voltage is applied, the on-state resistance increases. This is a phenomenon called current collapse. If the current collapse occurs, the on-state resistance significantly increases, resulting in a considerably serious problem with power transistors, to which a high drain voltage is applied.

In view of the aforementioned problems, it is an object of the present invention to provide a normally off semiconductor device made of a nitride semiconductor in which the current collapse is reduced or prevented, and a large current density and a high breakdown voltage characteristic are obtained.

Solution to the Problem

To achieve the aforementioned object, the present invention provides semiconductor devices having a configuration that an undoped or n-type semiconductor layer is provided in a region excluding a gate electrode formation region of a multilayer semiconductor structure.

Specifically, a first semiconductor device according to the present invention includes a first nitride semiconductor layer formed on a substrate, a second nitride semiconductor layer formed on the first nitride semiconductor layer and having a band gap energy larger than that of the first nitride semiconductor layer, a third nitride semiconductor layer formed on the second nitride semiconductor layer and doped with a p-type impurity, a fourth nitride semiconductor layer formed on the third nitride semiconductor layer and undoped or doped with an n-type impurity, and a gate electrode formed to contact the third nitride semiconductor layer in a region thereof exposed through an opening formed in the fourth nitride semiconductor layer.

According to a first semiconductor device, the third nitride semiconductor doped with a p-type impurity, the fourth nitride semiconductor layer formed on the third nitride semiconductor layer and undoped or doped with an n-type impurity, and the gate electrode formed to contact the third nitride semiconductor layer in a region thereof exposed through an opening formed in the fourth nitride semiconductor layer, are provided. Therefore, the rising voltage of the gate is allowed to have a value corresponding to the band gap energy of the nitride semiconductor, resulting in a large drain current. Moreover, the undoped or n-type fourth nitride semiconductor layer (electron supply layer) is left, except for the gate electrode formation portion thereof, whereby the distance between the upper surface of the fourth nitride semiconductor layer and the two-dimensional electron gas layer can be increased. As a result, the influence of a depletion layer formed by electrons trapped at the surface level on the two-dimensional electron gas layer can be reduced, whereby the current collapse can be reduced or prevented.

A second semiconductor device according to the present invention includes a first nitride semiconductor layer formed on a substrate, a second nitride semiconductor layer formed on the first nitride semiconductor layer and having a band gap energy larger than that of the first nitride semiconductor layer, a third nitride semiconductor layer formed on the second nitride semiconductor layer and having a band gap energy smaller than that of the second nitride semiconductor layer, a fourth nitride semiconductor layer formed on the third nitride semiconductor layer and having a band gap energy larger than that of the third nitride semiconductor layer, and a gate electrode formed to contact the third nitride semiconductor layer in a region thereof exposed through an opening formed in the fourth nitride semiconductor layer.

According to the second semiconductor device, the third nitride semiconductor having a band gap energy smaller than that of the second nitride semiconductor layer, the fourth nitride semiconductor layer formed on the third nitride semiconductor layer and having a band gap energy larger than that of the third nitride semiconductor layer, and the gate electrode formed to contact the third nitride semiconductor layer in a region thereof exposed through an opening formed in the fourth nitride semiconductor layer, are provided. Therefore, the rising voltage of the gate is allowed to have a value corresponding to the band gap energy of the nitride semiconductor, resulting in a large drain current. Moreover, the fourth nitride semiconductor layer (electron supply layer) is left, except for the gate electrode formation portion thereof, whereby the distance between the upper surface of the fourth nitride semiconductor layer and the two-dimensional electron gas layer can be increased. As a result, the influence of a depletion layer formed by electrons trapped at the surface level on the two-dimensional electron gas layer can be reduced, whereby the current collapse can be reduced or prevented.

A third semiconductor device according to the present invention a first nitride semiconductor layer formed on a substrate, a second nitride semiconductor layer formed on the first nitride semiconductor layer and having a band gap energy larger than that of the first nitride semiconductor layer, a third nitride semiconductor layer formed on the second nitride semiconductor layer and having a band gap energy smaller than that of the second nitride semiconductor layer, a fourth nitride semiconductor layer formed on the third nitride semiconductor layer and doped with an n-type impurity, and a gate electrode formed to contact the third nitride semiconductor layer in a region thereof exposed through an opening formed in the fourth nitride semiconductor layer.

According to the third semiconductor device, the third nitride semiconductor having a band gap energy smaller than that of the second nitride semiconductor layer, the fourth nitride semiconductor layer formed on the third nitride semiconductor layer and doped with an n-type impurity, and the gate electrode formed to contact the third nitride semiconductor layer in a region thereof exposed through an opening formed in the fourth nitride semiconductor layer, are provided. Therefore, the rising voltage of the gate is allowed to have a value corresponding to the band gap energy of the nitride semiconductor, resulting in a large drain current. Moreover, the fourth nitride semiconductor layer (electron supply layer) is left, except for the gate electrode formation portion thereof, whereby the distance between the upper surface of the fourth nitride semiconductor layer and the two-dimensional electron gas layer can be increased. As a result, the influence of a depletion layer formed by electrons trapped at the surface level on the two-dimensional electron gas layer can be reduced, whereby the current collapse can be reduced or prevented.

In the first semiconductor device, preferably, the first nitride semiconductor layer is made of $Al_xGa_{1-x}N$ where x is $0 \leq x < 1$, the second nitride semiconductor layer is preferably made of $Al_yGa_{1-y}N$ where y is $0 < y \leq 1$ and $x < y$, the third nitride semiconductor layer is made of $Al_zGa_{1-z}N$ where z is $0 \leq z \leq 1$, and the fourth nitride semiconductor layer is made of $Al_wGa_{1-w}N$ where w is $0 \leq w \leq 1$.

With this preferable configuration, a two-dimensional electron gas layer having a sheet carrier concentration of $1.0 \times 10^{13}$ cm$^{-2}$ or more can be formed at the interface between the first and second nitride semiconductor layers.

In the second or third semiconductor device, preferably, the first nitride semiconductor layer is made of $Al_xGa_{1-x}N$ where x is $0 \leq x < 1$, the second nitride semiconductor layer is made of $Al_yGa_{1-y}N$ where y is $0 < y \leq 1$ and $x < y$, the third nitride semiconductor layer is made of $In_zGa_{1-z}N$ where z is $0 < z \leq 1$, and the fourth nitride semiconductor layer is made of $Al_wGa_{1-w}N$ where w is $0 \leq w \leq 1$.

With this preferable configuration, a two-dimensional electron gas layer having a sheet carrier concentration of $1.0 \times 10^{13}$ cm$^{-2}$ or more can be formed at the interface between the first and second nitride semiconductor layers.

The semiconductor devices of the present invention each preferably further include an insulating film formed between the third nitride semiconductor layer and the gate electrode.

With this preferable configuration, the gate leakage current can be limited to a smaller level even when a gate voltage is applied.

The semiconductor devices of the present invention each preferably further include a source electrode and a drain electrode formed in regions between which the gate electrode is interposed, and contacting at least two of the first, second, third, and fourth semiconductor layers.

With this preferable configuration, the contact resistances to the source electrode and the drain electrode, which are ohmic electrodes, can be reduced.

Advantages of the Invention

According to the semiconductor devices of the present invention, an electron supply layer (fourth semiconductor layer) which is undoped or doped with an n-type impurity is left in a region excluding the gate electrode formation portion thereof. Therefore, the distance between the upper surface of the nitride semiconductor and the two-dimensional electron gas layer can be increased, whereby the influence of a depletion layer formed by electrons trapped at the surface level can be reduced. As a result, semiconductor devices made of a nitride semiconductor which are of the normally off type and which reduce or prevent the current collapse, can be provided.

DESCRIPTION OF REFERENCE CHARACTERS

101 Substrate
102 Buffer Layer
103 Undoped GaN Layer
104 Undoped AlGaN Layer
105 p-Type AlGaN Layer
106 High-Concentration p-Type GaN Layer
107 n-Type AlGaN Layer
107a Opening
108 Isolation Region
109 Protective Film
110 Source Electrode
111 Drain Electrode
112 Gate Electrode
201 Substrate
202 Buffer Layer
203 Undoped GaN Layer
204 Undoped AlGaN Layer
205 p-Type Composition Gradient AlGaN Layer
206 High-Concentration p-Type GaN Layer
207 n-Type Composition Gradient AlGaN Layer
207a Opening
208 Isolation Region
209 Protective Film
210 Source Electrode
211 Drain Electrode
212 Gate Electrode
301 Substrate
302 Buffer Layer
303 Undoped GaN Layer
304 Undoped AlGaN Layer
305 Undoped InGaN Layer
306 Undoped AlGaN Layer 306a Opening
308 Isolation Region
309 Protective Film
310 Source Electrode
311 Drain Electrode
312 Gate Electrode

DESCRIPTION OF EMBODIMENTS

First Embodiment

A first embodiment of the present invention will be described with reference to the accompanying drawings.

Figure 1:
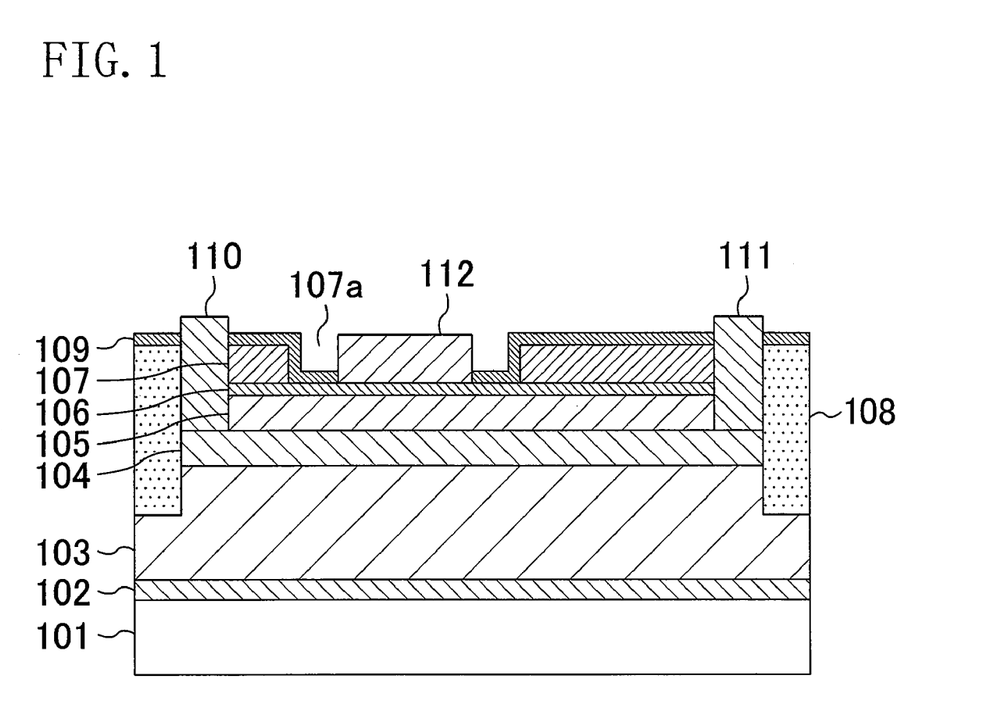
FIG. 1 is a cross-sectional view showing a semiconductor device according to a first embodiment of the present invention.

FIG. 1 is a cross-sectional view of a configuration of a field effect transistor which is a semiconductor device according to a first embodiment of the present invention. As shown in FIG. 1, the field effect transistor of the first embodiment includes a buffer layer 102 made of aluminum nitride (AlN) having a thickness of 100 nm, an undoped gallium nitride (GaN) layer 103 having a thickness of 2 μm, an undoped aluminum gallium nitride (AlGaN) layer 104 having a thickness of 25 nm, a p-type AlGaN layer 105 having a thickness of 50 nm, a high-concentration p-type GaN layer 106 having a thickness of 5 nm, and an n-type AlGaN layer 107 having a thickness of 20 nm, which are successively formed, by epitaxial growth, on a main surface of a substrate 101 made of sapphire, where the main surface has a plane orientation (0001) (i.e., a (0001) plane). Here, the Al composition of each of the AlGaN layers 104, 105, and 107 is assumed to be 25%. Note that the undoped GaN layer 103 may be made of $Al_xGa_{1-x}N$ where x is $0 \leq x \leq 1$, the undoped AlGaN layer 104 may be made of $Al_yGa_{1-y}N$ where y is $0 < y \leq 1$ and x<y, the p-type AlGaN layer 105 and the p-type high-concentration GaN layer 106 may be made of $Al_zGa_{1-z}N$ where z is $0 \leq z \leq 1$, and the n-type AlGaN layer 107 may be made of $Al_wGa_{1-w}N$ where w is $0 \leq w \leq 1$.

The n-type AlGaN layer 107 is selectively etched to form an opening 107a which is a gate electrode formation portion exposing the high-concentration p-type GaN layer 106. In the opening 107a, a gate electrode 112 made of nickel (Ni) is formed to make ohmic contact with the high-concentration p-type GaN layer 106.

A source electrode 110 and a drain electrode 111 each made of titanium (Ti)/aluminum (Al) are formed in regions on opposite sides of the opening 107a which are located at respective distances from the opening 107a. Specifically, the n-type AlGaN layer 107, the high-concentration p-type GaN layer 106, and the p-type AlGaN layer 105 are hollowed out from above to expose the undoped AlGaN layer 104. Thereafter, the source electrode 110 and the drain electrode 111 are formed in the exposed regions to contact the undoped AlGaN layer 104.

A protective film 109 made of silicon nitride (SiN) is formed on the upper surface of the n-type AlGaN layer 107 and the bottom surface and the wall surface of the opening 107a, excluding the source electrode 110, the drain electrode 111, and the gate electrode 112.

Isolation regions 108 having a high resistance are formed in regions on sides farther from the gate electrode 112 of the source electrode 110 and the drain electrode 111, by implanting argon (Ar) ions or the like into the regions so that the Ar ions or the like reach an upper portion of the undoped GaN layer 103.

Here, the carrier concentration of the p-type AlGaN layer 105 is preferably $1 \times 10^{18}$ cm$^{-3}$ or more in order to reduce or prevent extension of the depletion layer into the p-type AlGaN layer 105. The carrier concentration of the high-concentration p-type GaN layer 106 is preferably $2 \times 10^{18}$ cm$^{-3}$ or more in order to reduce an ohmic contact resistance at the gate electrode 112. Carriers are preferably depleted from the p-type AlGaN layer 105, the high-concentration p-type GaN layer 106, and the n-type AlGaN layer 107, excluding the gate electrode formation portion, in order to reduce a leakage current between the source electrode 110 and the gate electrode 112 and between the drain electrode 111 and the gate electrode 112. The depletion allows reduction or prevention of the leakage current and improvement of the breakdown voltage of the transistor. Note that the high-concentration p-type GaN layer 106 does not necessarily need to be provided. Instead of the high-concentration p-type GaN layer 106, a high-concentration p-type AlGaN layer having the same composition ratio of Al as that of the p-type AlGaN layer 105 may be provided. Thus, by providing the high-concentration p-type AlGaN layer having the same composition ratio of Al as that of the p-type AlGaN layer 105, a band gap energy discontinuity does not occur at the interface between the undoped AlGaN layer 104 and the p-type AlGaN layer 105, the interface between the p-type AlGaN layer 105 and the high-concentration p-type AlGaN layer, or the interface between the high-concentration p-type AlGaN layer and the n-type AlGaN layer 107, and therefore, electrons and positive holes are not accumulated. As a result, the leakage current can be reduced or prevented, whereby the breakdown voltage of the transistor can be improved.

Figure 2:
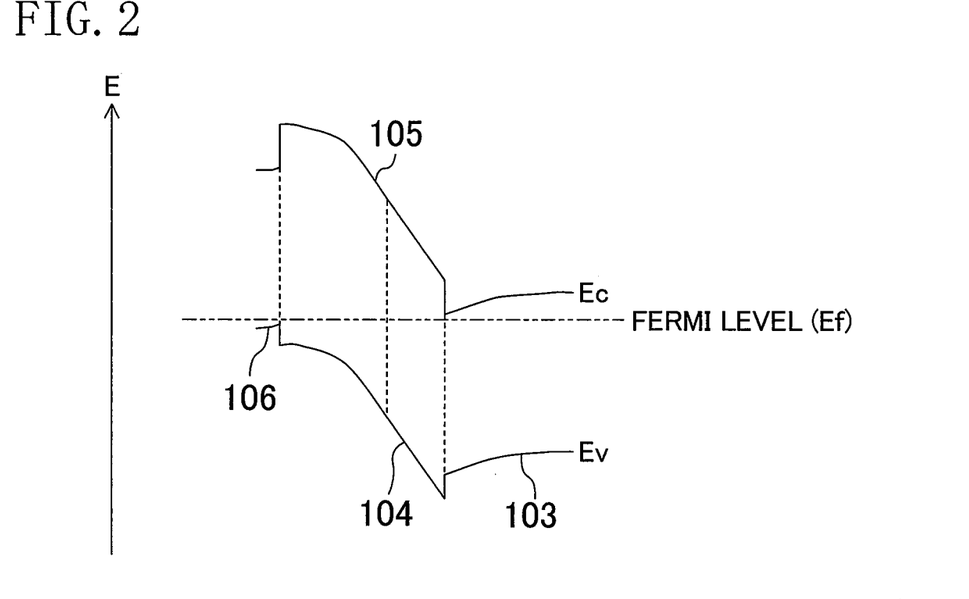
FIG. 2 is a diagram showing the energy band of the gate electrode formation portion of the semiconductor device of the first embodiment of the present invention.

FIG. 2 shows the energy band of the gate electrode formation portion in each semiconductor layer of the field effect transistor of the first embodiment of the present invention. As shown in FIG. 2, at the heterointerface between the undoped GaN layer 103 and the undoped AlGaN layer 104, even though the junction is made between the undoped semiconductor layers, a downward potential valley is formed in the conduction band Ec due to electric charge generated by spontaneous polarization and piezoelectric polarization.

In the gate electrode formation portion, the p-type AlGaN layer 105 and the high-concentration p-type GaN layer 106 are connected to the undoped AlGaN layer 104, whereby the potential energies E of the undoped AlGaN layer 104 and the undoped GaN layer 103 are increased. Therefore, the potential valley formed at the heterointerface between the undoped AlGaN layer 104 and the undoped GaN layer 103 is located above the Fermi energy Ef. As a result, when a bias voltage is not applied to the gate electrode 112, a two-dimensional electron gas layer is not formed in the conduction band Ec at the heterointerface between the undoped AlGaN layer 104 and the undoped GaN layer 103, resulting in a normally off state.

Figure 3:
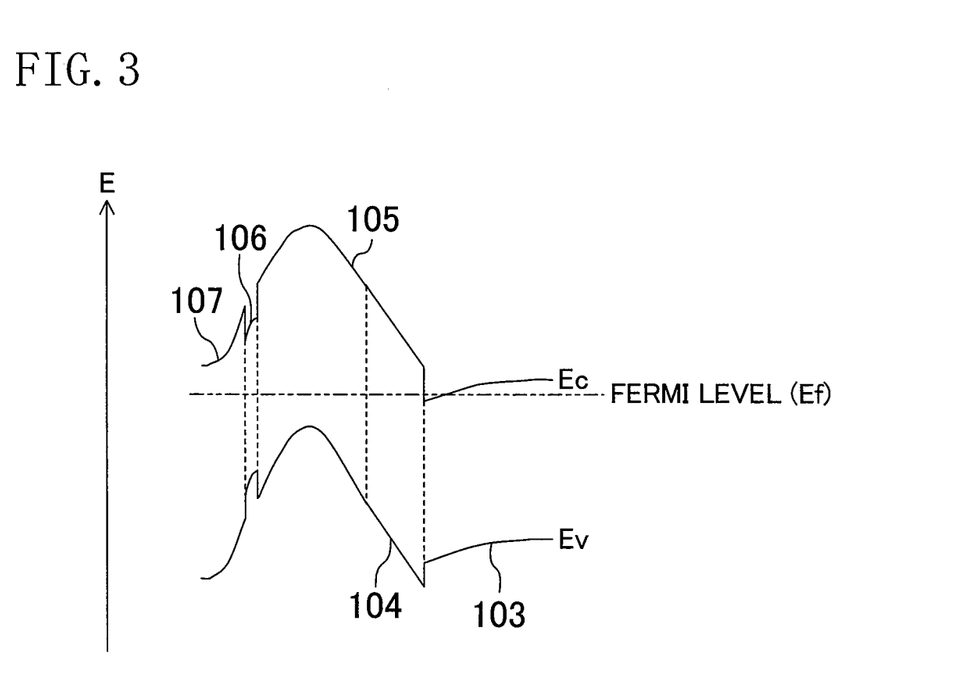
FIG. 3 is a diagram showing the energy band of the device region excluding the gate electrode formation portion of the semiconductor device of the first embodiment of the present invention.

FIG. 3 shows the energy band of the device region excluding the gate electrode formation portion in each semiconductor layer of the field effect transistor of the first embodiment of the present invention. As shown in FIG. 3, in the device region excluding the gate electrode formation portion, because the n-type AlGaN layer 107 is connected to the high-concentration p-type GaN layer 106, the potential energies E of the undoped AlGaN layer 104 and the undoped GaN layer 103 which are raised due to the connection of the p-type AlGaN layer 105 and the high-concentration p-type GaN layer 106 to the undoped AlGaN layer 104, is lowered due to the connection of the n-type AlGaN layer 107 to the high-concentration p-type GaN layer 106. As a result, a valley in the conduction band Ec formed at the heterointerface between the undoped AlGaN layer 104 and the undoped GaN layer 103 is located below the Fermi energy Ef. Therefore, a two-dimensional electron gas layer is formed at the heterointerface between the undoped AlGaN layer 104 and the undoped GaN layer 103, resulting in a normally on state. Also, because a distance between the upper surface of the device region and the two-dimensional electron gas layer is increased by providing the n-type AlGaN layer 107, a depletion layer formed by electrons trapped at the surface level doe not reach the two-dimensional electron gas layer, whereby the current collapse is reduced or prevented.

Figure 4:
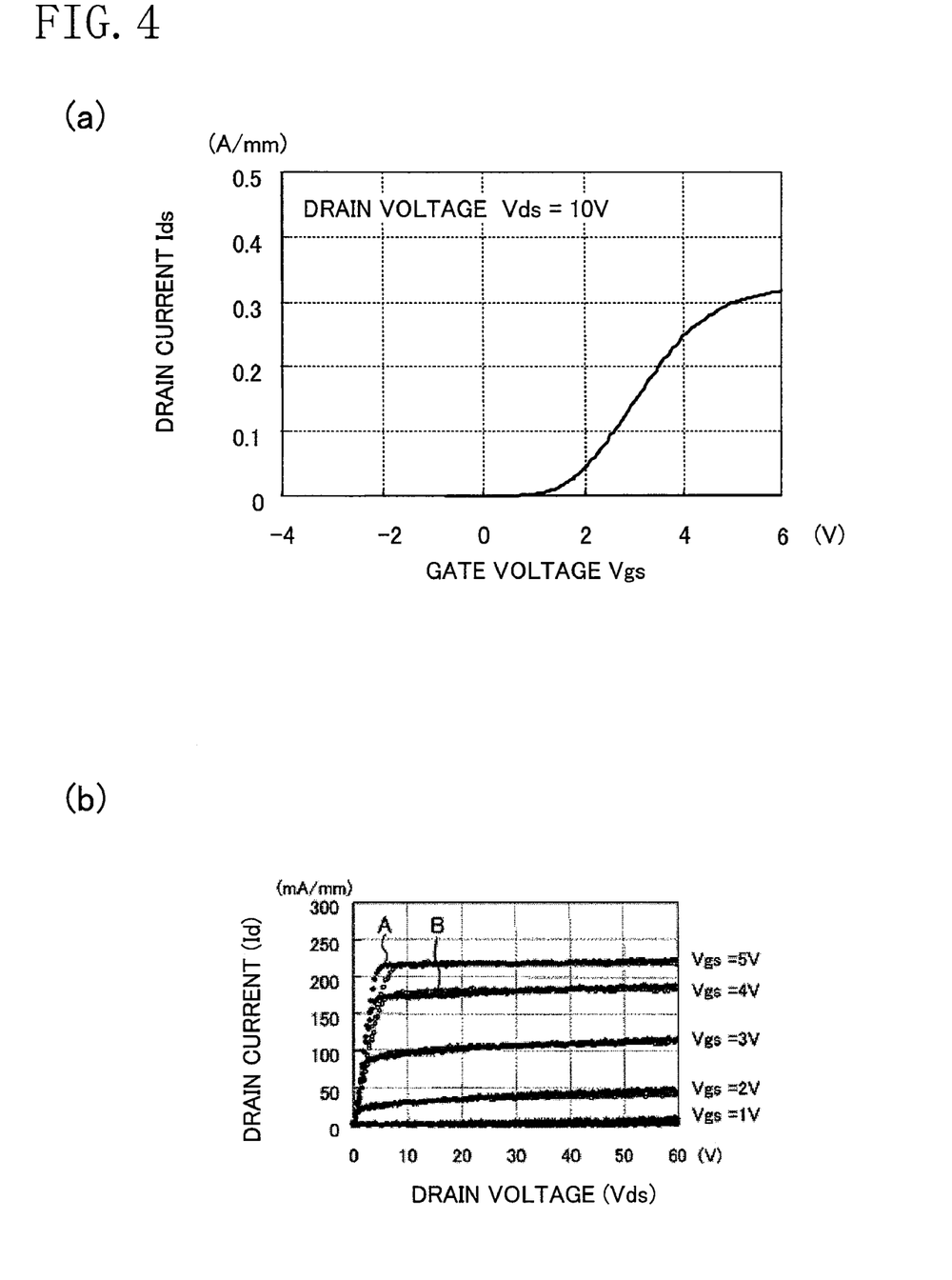
FIG. 4(a) is a graph showing a relationship between drain currents and gate voltages in the semiconductor device of the first embodiment of the present invention.
FIG. 4(b) is a graph showing a relationship between drain currents and gate voltages in the semiconductor device of the first embodiment of the present invention, as measured when a pulse voltage is applied.

FIGS. 4(a) and 4(b) show current-voltage (I-V) characteristics of the field effect transistor thus formed. FIG. 4(a) shows a relationship between the gate voltage Vgs and the drain current Ids as measured when the drain voltage Vds is set to 10 V. As can be seen from FIG. 4(a), the field effect transistor of the first embodiment is of the normally off type. FIG. 4(b) shows a relationship between the drain current Id and the drain voltage Vds as measured when pulse voltages having the same period are applied to the gate electrode 112 and the drain electrode 111 of the nitride semiconductor device of FIG. 1. Here, it is assumed that the pulse voltages applied to the gate electrode 112 and the drain electrode 111 have a pulse width of 0.5 μs and a pulse interval of 1 ms. In FIG. 4(b), lines A are obtained when the gate voltage and the drain voltage are both 0 V before the pulse voltage is applied (bias conditions), and lines B are obtained when the gate voltage is 0 V and the drain voltage is 60 V before the pulse voltage is applied (bias conditions). As can be seen from FIG. 4(b), for all of the gate voltages Vgs of 1 V to 5 V, the characteristics of the line B substantially match those of the line A which are obtained when a high drain voltage is not applied, over the drain voltage Vds range of 10 V to 60 V. Therefore, it can be seen that the on-state resistance does not vary, and therefore, the current collapse is reduced or prevented.

Second Embodiment

A second embodiment of the present invention will be described hereinafter with reference to the drawings.

Figure 5:
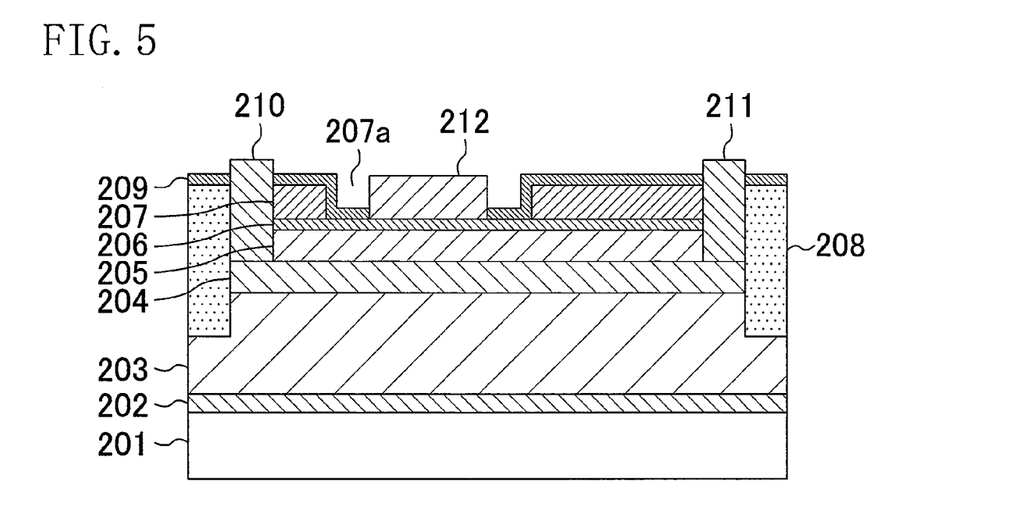
FIG. 5 is a cross-sectional view showing a semiconductor device according to a second embodiment of the present invention.

FIG. 5 is a cross-sectional view of a configuration of a field effect transistor which is a semiconductor device according to a second embodiment of the present invention. As shown in FIG. 5, the field effect transistor of the second embodiment includes a buffer layer 202 made of aluminum nitride (AlN) having a thickness of 100 nm, an undoped gallium nitride (GaN) layer 203 having a thickness of 2 μm, an undoped aluminum gallium nitride (AlGaN) layer 204 having a thickness of 25 nm, a p-type composition gradient AlGaN layer 205 having a thickness of 50 nm, a high-concentration p-type GaN layer 206 having a thickness of 5 nm, an n-type composition gradient AlGaN layer 207 having a thickness of 20 nm, which are successively formed, by epitaxial growth, on a main surface of a substrate 201 made of sapphire, where the main surface has a plane orientation (0001) (i.e., a (0001) plane). Here, the Al composition of the undoped AlGaN layer 204 is assumed to be 25%. The Al composition of the p-type composition gradient AlGaN layer 205 is decreased in a continuous or stepwise fashion from 25% at a surface thereof facing the undoped AlGaN layer 204 to 0% at a surface thereof facing the high-concentration p-type GaN layer 206. The Al composition of the n-type composition gradient AlGaN layer 207 is increased in a continuous or stepwise fashion from 0% a surface thereof facing the high-concentration p-type GaN layer 206 to 25% at an upper surface thereof.

The n-type composition gradient AlGaN layer 207 is selectively etched to form an opening 207a which is a gate electrode formation portion exposing the high-concentration p-type GaN layer 206. In the opening 207a, a gate electrode 212 made of Ni is formed to make ohmic contact with the high-concentration p-type GaN layer 206.

A source electrode 210 and a drain electrode 211 each made of Ti/Al are formed in regions on opposite sides of the opening 207a which are located at respective distances from the opening 207a. Specifically, the high-concentration p-type GaN layer 206 and the p-type composition gradient AlGaN layer 205 are hollowed out from above to expose the undoped AlGaN layer 204. Thereafter, the source electrode 210 and the drain electrode 211 are formed in the exposed regions to contact the undoped AlGaN layer 204.

A protective film 209 made of SiN is formed on the upper surface of the n-type AlGaN layer 207 and the bottom surface and the wall surface of the opening 207a, excluding the source electrode 210, the drain electrode 211, and the gate electrode 212.

Isolation regions 208 having a high resistance are formed in regions on sides farther from the gate electrode 212 of the source electrode 210 and the drain electrode 211, by implanting Ar ions or the like into the regions so that the Ar ions or the like reach an upper portion of the undoped GaN layer 203.

Figure 6:
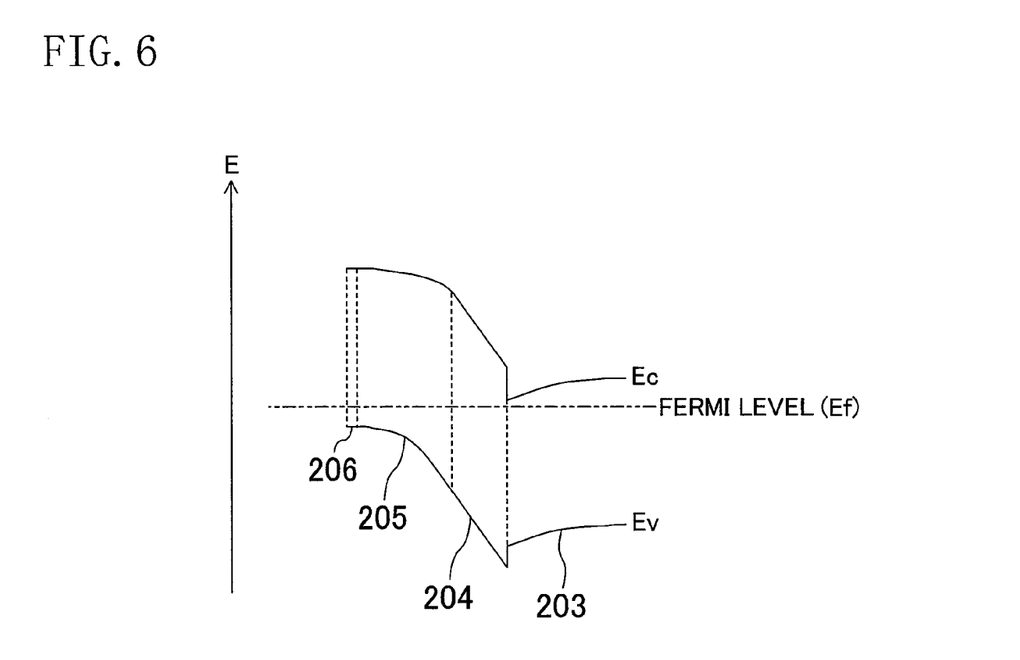
FIG. 6 is a diagram showing the energy band of the gate electrode formation portion of the semiconductor device of the second embodiment of the present invention.

FIG. 6 shows the energy band of the gate electrode formation portion in each semiconductor layer of the field effect transistor of the second embodiment of the present invention. As shown in FIG. 6, by causing the Al composition x of the p-type composition gradient $Al_xGa_{1-x}N$ ($0 \leq x \leq 0.25$) layer 205 in the vicinity of the interface between the high-concentration p-type GaN layer 206 and the p-type composition gradient $Al_xGa_{1-x}N$ ($0 \leq x \leq 0.25$) layer 205 to be 0, a band gap energy discontinuity does not occur at the interface between the p-type composition gradient AlGaN layer 205 and the high-concentration p-type GaN layer 206.

In the first embodiment of FIG. 2, a band gap energy discontinuity occurs at the heterointerface between the high-concentration p-type GaN layer 106 and the p-type AlGaN layer 105, and therefore, a leakage current flows due to positive holes accumulated at the heterointerface, resulting in a decrease in the off-state breakdown voltage.

In contrast to this, in the second embodiment, positive holes are not accumulated at the interface between the p-type composition gradient AlGaN layer 205 and the high-concentration p-type GaN layer 206, and therefore, a leakage current can be reduced or prevented, resulting in an improvement in the off-state breakdown voltage.

Figure 7:
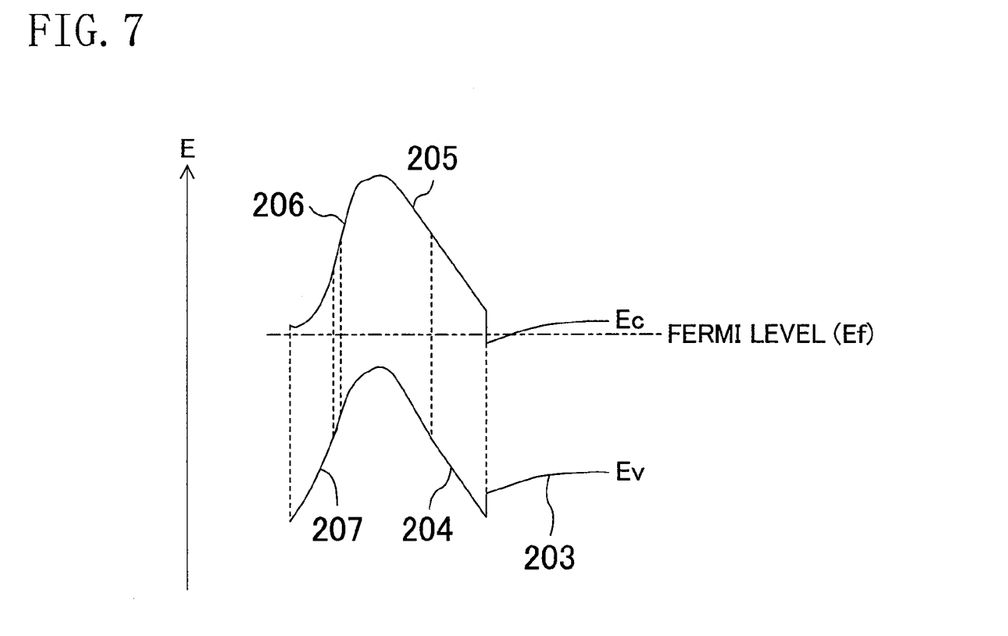
FIG. 7 is a diagram showing the energy band of the device region excluding the gate electrode formation portion of the semiconductor device of the second embodiment of the present invention.

FIG. 7 shows the energy band of the device region excluding the gate electrode formation portion in each semiconductor layer of the field effect transistor of the second embodiment of the present invention. As shown in FIG. 7, by causing the Al composition x of the n-type composition gradient $Al_xGa_{1-x}N$ ($0 \leq x \leq 0.25$) layer 207 in the vicinity of the interface between the high-concentration p-type GaN layer 206 and the n-type composition gradient $Al_xGa_{1-x}N$ ($0 \leq x \leq 0.25$) layer 207 to be 0, a band gap energy discontinuity does not occur at the interface between the n-type composition gradient AlGaN layer 207 and the high-concentration p-type GaN layer 206.

In the first embodiment of FIG. 3, a band gap energy discontinuity occurs at the heterointerface between the high-concentration p-type GaN layer 106 and the n-type AlGaN layer 107, and therefore, a leakage current flows due to electrons accumulated in the heterointerface, resulting in a decrease in the off-state breakdown voltage.

In contrast to this, in the second embodiment, electrons are not accumulated at the interface between the high-concentration p-type GaN layer 206 and the n-type composition gradient AlGaN layer 207, and therefore, a leakage current can be reduced or prevented, resulting in an improvement in the off-state breakdown voltage.

Third Embodiment

A third embodiment of the present invention will be described hereinafter with reference to the drawings.

Figure 8:
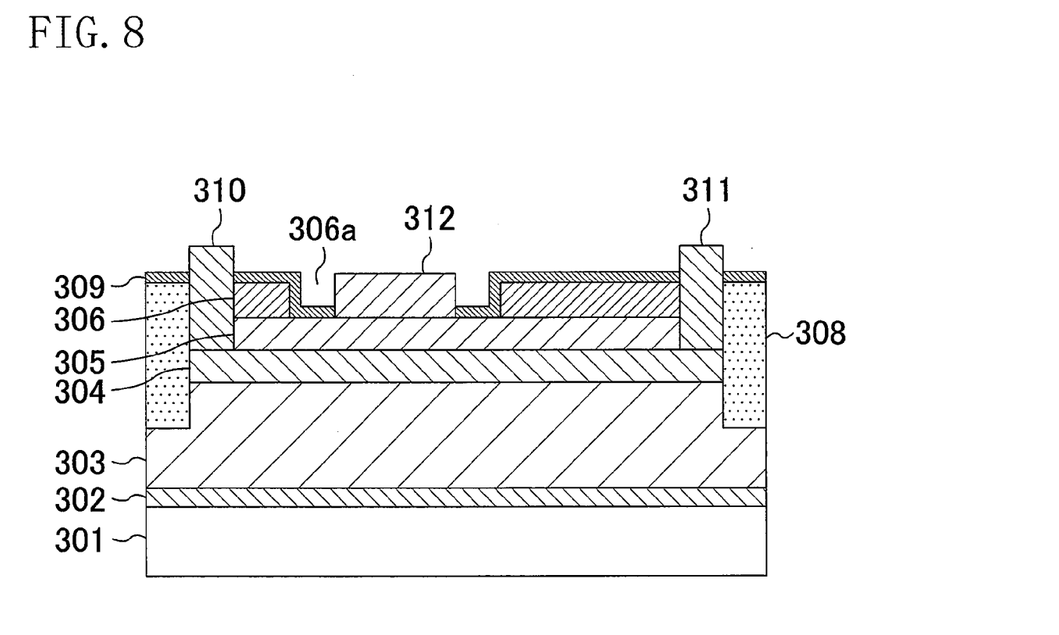
FIG. 8 is a cross-sectional view showing a semiconductor device according to a third embodiment of the present invention.

FIG. 8 is a cross-sectional view of a configuration of a field effect transistor which is a semiconductor device according to a third embodiment of the present invention. As shown in FIG. 8, the field effect transistor of the third embodiment includes a buffer layer 302 made of AlN having a thickness of 100 nm, an undoped GaN layer 303 having a thickness of 2 µm, an undoped AlGaN layer 304 having a thickness of 25 nm, an undoped indium gallium (InGaN) layer 305 having a thickness of 5 nm, and an undoped AlGaN layer 306 having a thickness of 20 nm, which are successively formed, by epitaxial growth, on a main surface of a substrate 301 made of sapphire, where the main surface has a plane orientation (0001) (i.e., a (0001) plane). Here, the Al composition of each of the AlGaN layers 304 and 306 is assumed to be 25%, and the In composition of the undoped InGaN layer 305 is assumed to be 20%.

The undoped AlGaN layer 306 is selectively etched to form an opening 306a which is a gate electrode formation portion exposing the undoped InGaN layer 305. In the opening 306a, a gate electrode 312 made of Ni is formed to contact the undoped InGaN layer 305.

A source electrode 310 and a drain electrode 311 each made of Ti/Al are formed in regions on opposite sides of the opening 306a which are located at respective distances from the opening 306a. Specifically, the undoped AlGaN layer 306 and the undoped InGaN layer 305 are hollowed out from above to expose the undoped AlGaN layer 304. Thereafter, the source electrode 310 and the drain electrode 311 are formed in the exposed regions to contact the undoped AlGaN layer 304.

A protective film 309 made of SiN is formed on the upper surface of the undoped AlGaN layer 306 and the bottom surface and the wall surface of the opening 306a, excluding the source electrode 310, the drain electrode 311, and the gate electrode 312.

Isolation regions 308 having a high resistance are formed in regions on sides farther from the gate electrode 312 of the source electrode 310 and the drain electrode 311, by implanting Ar ions or the like into the regions so that the Ar ions or the like reach an upper portion of the undoped GaN layer 303.

Figure 9:
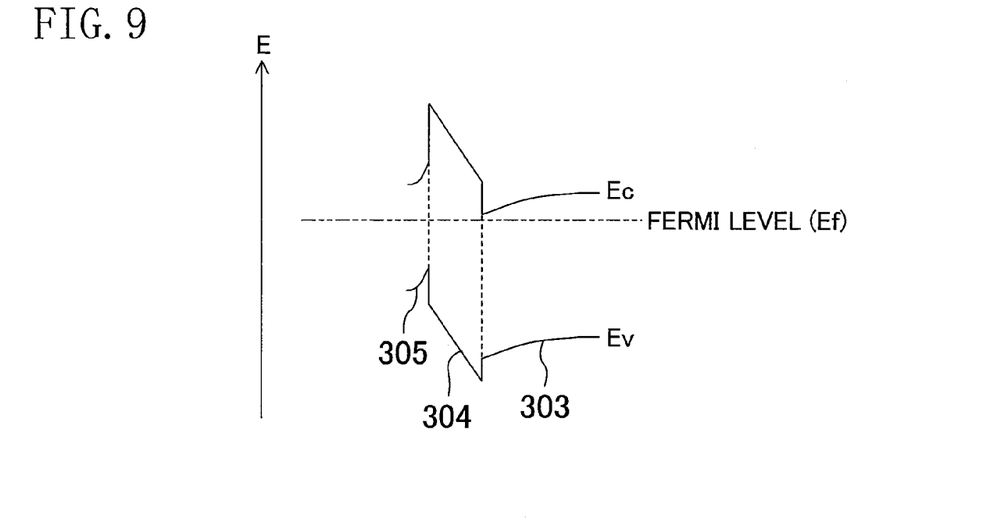
FIG. 9 is a diagram showing the energy band of the gate electrode formation portion of the semiconductor device of the third embodiment of the present invention.

FIG. 9 shows the energy band of the gate electrode formation portion in each semiconductor layer of the field effect transistor of the third embodiment of the present invention. As shown in FIG. 9, at the heterointerface between the undoped GaN layer 303 and the undoped AlGaN layer 304, even though the junction is made between the undoped layers, an electric field directed upward from the substrate 301 is generated in the undoped AlGaN layer 304 by electric charge induced by spontaneous polarization and piezoelectric polarization. Therefore, a downward potential valley is formed in the conduction band Ec at the heterointerface between the undoped GaN layer 303 and the undoped AlGaN layer 304. Also, at the heterointerface between the undoped AlGaN layer 304 and the undoped InGaN layer 305, even though the junction is made between the undoped layers, an electric field directed toward the substrate 301 is generated in the undoped InGaN layer 305 by electric charge induced by spontaneous polarization and piezoelectric polarization. These electric fields raise the potential energies of the undoped GaN layer 303 and the undoped AlGaN layer 304, so that the potential valley formed in the conduction band Ec at the heterointerface between the undoped GaN layer 303 and the undoped AlGaN layer 304 is located above the Fermi energy Ef. As a result, when a bias voltage is not applied to the gate electrode 312, a two-dimensional electron gas layer is not formed in the conduction band Ec at the heterointerface between the undoped GaN layer 303 and the undoped AlGaN layer 304, resulting in a normally off state.

Figure 10:
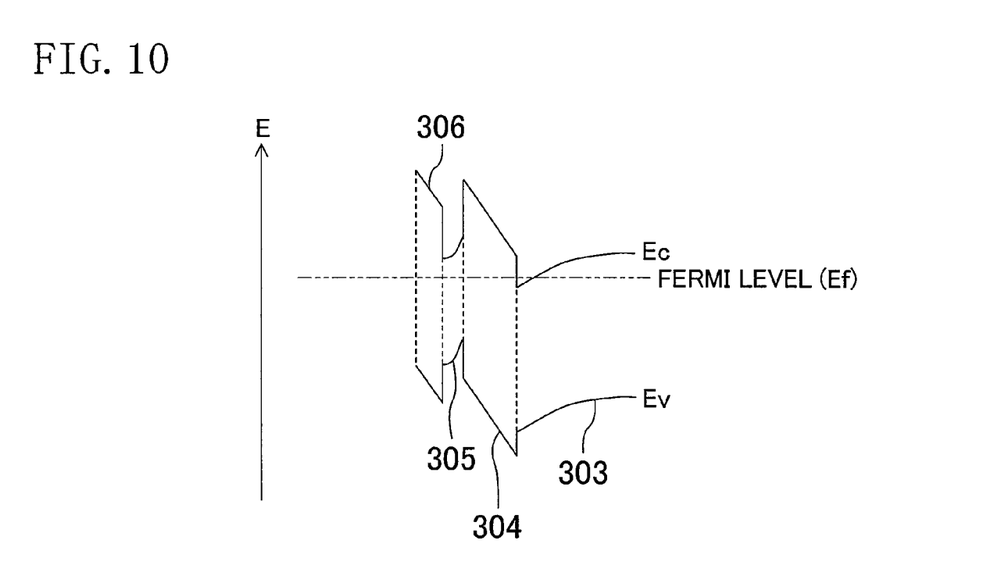
FIG. 10 is a diagram showing the energy band of the device region excluding the gate electrode formation portion of the semiconductor device of the third embodiment of the present invention.

FIG. 10 shows the energy band of the device region excluding the gate electrode formation portion in each semiconductor layer of the field effect transistor of the third embodiment of the present invention. As shown in FIG. 10, in the device region excluding the gate electrode formation portion, the undoped AlGaN layer 306 is connected to the undoped InGaN layer 305. Therefore, at the heterointerface between the undoped InGaN layer 305 and the undoped AlGaN layer 306, even though the junction is made between the undoped semiconductor layers, an electric field directed upward from the substrate is generated in the undoped AlGaN layer 306 by electric charge induced by spontaneous polarization and piezoelectric polarization. The electric field thus generated lowers the potential energies E of the undoped GaN layer 303 and the undoped AlGaN layer 304 raised by the connection between the undoped InGaN layer 305 and the undoped AlGaN layer 306. Therefore, a potential valley formed in the conduction band Ec at the heterointerface between the undoped GaN layer 303 and the undoped AlGaN layer 304 is located below the Fermi energy Ef. As a result, a two-dimensional electron gas layer is formed in the conduction band Ec at the heterointerface between the undoped GaN layer 303 and the undoped AlGaN layer 304, resulting in a normally on state.

Also, in the third embodiment, because the undoped AlGaN layer 306 is provided on the undoped InGaN layer 305, the distance between the upper surface of the device region (here, the upper surface of the undoped AlGaN layer 306) and the two-dimensional electron gas layer is increased. Therefore, a depletion layer which is formed by electrons trapped at the surface level of the device region does not reach the two-dimensional electron gas layer, whereby the current collapse is reduced or prevented.

Variation of Third Embodiment

Figure 11:
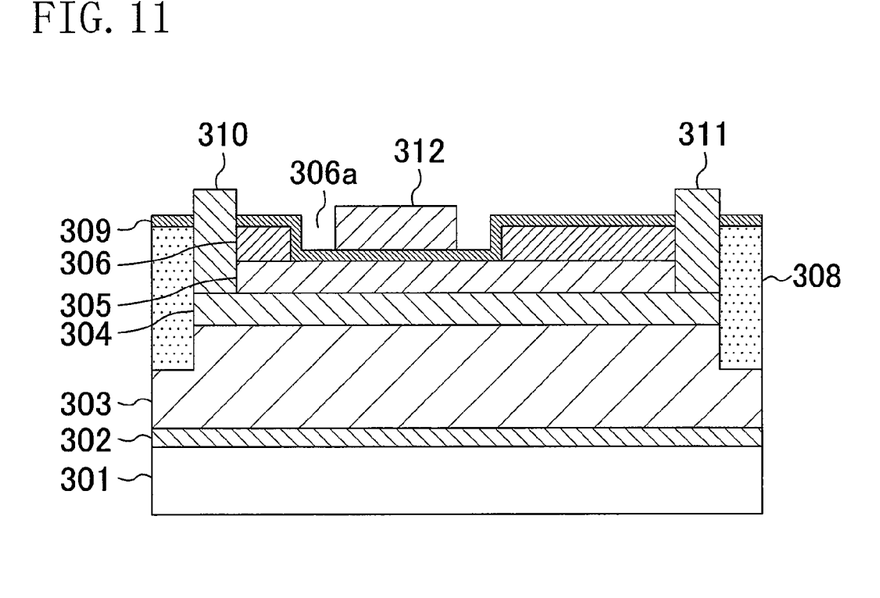
FIG. 11 is a cross-sectional view showing a semiconductor device according to a variation of the third embodiment of the present invention.

FIG. 11 is a cross-sectional view of a configuration of a field effect transistor according to a variation of the third embodiment. The field effect transistor of this variation of FIG. 11 is different from the field effect transistor of the third embodiment only in that the gate electrode 312 is formed on the undoped InGaN layer 305 exposed through the opening 306a with a protective film 309 made of SiN being interposed therebetween. Such a configuration can limit the gate leakage current to a smaller level even when a positive gate voltage is applied to the gate electrode 312.

Note that this variation is not limited to the third embodiment and is applicable to the first and second embodiments.

In the first to third embodiments and the variations thereof, the distance between the gate electrode and the source electrode is larger than the distance between the gate electrode and the drain electrode. Note that this is preferable for the purpose of improving the drain breakdown voltage in power transistors, although the gate electrode does not necessarily need to be located so that the distance between the gate electrode and the source electrode is larger than the distance between the gate electrode and the drain electrode.

Although, in the first embodiment, the undoped GaN layer 103 is used as an electron traveling layer, and the undoped $Al_{0.25}Ga_{0.75}N$ layer 104 is used as a barrier layer which is formed on the undoped GaN layer 103 and has a larger band gap energy than that of the undoped GaN layer 103, the present invention is not limited to this composition. Specifically, the GaN layer 103 may be an AlGaN layer as long as the Al composition of the layer 103 is smaller than that of the AlGaN layer 104. This holds true in the other embodiments.

INDUSTRIAL APPLICABILITY

The present invention provides semiconductor devices made of a nitride semiconductor which are of the normally off type and reduce or prevent the current collapse. The present invention is useful for, for example, semiconductor devices made of a nitride semiconductor which are applicable to power transistors for use in power supply circuits for consumer apparatuses.

The invention claimed is:

1. A semiconductor device comprising:
a first nitride semiconductor layer formed on a substrate;
a second nitride semiconductor layer formed on the first nitride semiconductor layer and having a band gap energy larger than that of the first nitride semiconductor layer;
a third nitride semiconductor layer formed on the second nitride semiconductor layer and having a band gap energy smaller than that of the second nitride semiconductor layer;
a fourth nitride semiconductor layer formed on the third nitride semiconductor layer and having a band gap energy larger than that of the third nitride semiconductor layer; and
a gate electrode formed to contact the third nitride semiconductor layer in a region thereof exposed through an opening formed in the fourth nitride semiconductor layer;
wherein the third nitride semiconductor layer is undoped, and
the third nitride semiconductor layer is in contact with the fourth nitride semiconductor layer.

2. The semiconductor device of claim 1, wherein
the first nitride semiconductor layer is made of $Al_xGa_{1-x}N$ where x is $0 \leq x < 1$,
the second nitride semiconductor layer is made of $Al_yGa_{1-y}N$ where y is $0 < y \leq 1$ and $x < y$,
the third nitride semiconductor layer is made of $In_zGa_{1-z}N$ where z is $0 < z \leq 1$, and
the fourth nitride semiconductor layer is made of $Al_wGa_{1-w}N$ where w is $0 \leq w \leq 1$.

3. The semiconductor device of claim 1, further comprising:
an insulating film formed between the third nitride semiconductor layer and the gate electrode.

4. The semiconductor device of claim 1, further comprising:
a source electrode and a drain electrode formed in regions between which the gate electrode is interposed, and contacting at least two of the first, second, third, and fourth semiconductor layers.

5. The semiconductor device of claim 1, wherein a thickness of the third nitride semiconductor layer is larger than a thickness of the second nitride semiconductor layer.

6. The semiconductor device of claim 5, wherein
the second nitride semiconductor layer is a single layer, and
the third nitride semiconductor layer is a single layer.

7. The semiconductor device of claim 1, wherein the source electrode is in contact with an isolation region.

8. The semiconductor device of claim 1, wherein the fourth nitride semiconductor layer is undoped.

* * * * *